United States Patent
Chang et al.

(10) Patent No.: US 7,439,540 B2
(45) Date of Patent: Oct. 21, 2008

(54) ORGANIC ELECTROLUMINESCENT DISPLAY

(75) Inventors: Yi-Cheng Chang, Taipei (TW); Shuo-Hsiu Hu, Tainan (TW)

(73) Assignee: AU Optronics Corp., Hsinchu (TW)

( * ) Notice: Subject to any disclaimer, the term of this patent is extended or adjusted under 35 U.S.C. 154(b) by 0 days.

(21) Appl. No.: 11/224,973

(22) Filed: Sep. 14, 2005

(65) Prior Publication Data
US 2006/0175602 A1 Aug. 10, 2006

(30) Foreign Application Priority Data
Feb. 5, 2005 (TW) .............................. 94103861 A

(51) Int. Cl.
*H01L 27/15* (2006.01)
*H01J 1/62* (2006.01)

(52) U.S. Cl. .............................. 257/59; 257/72; 257/83; 257/E27.131; 313/500; 313/511

(58) Field of Classification Search ................ 313/500, 313/505, 506, 511, 512; 257/40, 59, 72, 257/83, E27.131
See application file for complete search history.

(56) References Cited

U.S. PATENT DOCUMENTS

| 2004/0174487 A1* | 9/2004 | Yamazaki et al. | ............. 349/150 |
| 2005/0197030 A1* | 9/2005 | Yamazaki et al. | ............. 445/24 |
| 2005/0253773 A1* | 11/2005 | Sekiguchi | ............. 345/1.1 |
| 2006/0109394 A1* | 5/2006 | Miyagawa et al. | ............. 349/58 |
| 2006/0221269 A1* | 10/2006 | Kawaguchi | ............. 349/58 |

FOREIGN PATENT DOCUMENTS

| CN | 1329457 | 1/2002 |
| CN | 1410954 | 4/2003 |
| JP | 6230728-H05B33/02 | 8/1994 |

\* cited by examiner

*Primary Examiner*—Minh-Loan T Tran
(74) *Attorney, Agent, or Firm*—Chih Feng Yeh

(57) ABSTRACT

An invention relates to an organic electroluminescent display. The organic electroluminescent display comprises a substrate, a bonding pad, and an FPC (Flexible Print Circuit). The substrate comprises a luminescent surface and a non-luminescent surface. An organic electroluminescent (EL) structure is disposed on the non-luminescent surface to provide the organic EL structure to electrically connect to an outer circuit. The FPC, disposed on the same side of the organic electroluminescent structure, comprises a junction portion and a main portion, in which the main portion connects to the junction portion and electrically connects to the outer circuit. The junction portion is adapted to connect to the bonding pad and the main portion is directly extended to the direction toward the organic electroluminescent structure.

3 Claims, 2 Drawing Sheets

ORGANIC ELECTROLUMINESCENT DISPLAY

BACKGROUND OF THE INVENTION (1) Field of the Invention

The invention relates to an electroluminescencet (EL) display, and more particularly to a design of the flexible printed circuit (FPC) extending to the organic EL structure.

(2) Description of the Prior Art

The organic electroluminescent display is characterized in high illumination, high reaction rate, lightness in weight, thinness, full color, and no need of backlight.

Please refer to FIG. 1, which is a side view of the organic EL display module 1. The organic EL display module 1 comprises a glass substrate 11, an organic EL structure 12, a package frame 13, and an FPC 14.

The organic EL structure 12, disposed under the glass substrate 11, further comprises an upper electrode, a lower electrode, and an organic multilayer structure having a hole injection layer, an active layer, and an electron injection layer (not shown in the figure). The upper and lower electrode can provide a bias voltage to the organic multiplayer, and electricity for activating the active layer is yielded after the electric hole and the electron combine in the active layer. The electricity activates the organic molecule of the active layer to an active state, and the light is released later on after the activated organic molecules discharge to fall back to a ground state.

Additionally, the upper electrode electrically connects to the FPC 14 via a bonding pad 111. The FPC 14 comprises a junction portion 141 and a main portion 142. As shown in FIG.1, the FPC 14 connects to the bonding pad 111 via its junction portion 141, and the main portion 142 extends along the direction leaving the organic EL structure 12. The FPC 14 can receive an image control signal from outer circuits to control the image display of the organic EL display module.

While assembling the organic EL display module described above into a product case (ex. a mobile phone), for the case space is limited and the FPC needs to protrude out of the the luminescent display, a bending process of the FPC is unavoidable. To reduce the possibility of damage from the bending process, a better material for the FPC, thus higher cost is required to suit the product application.

In the art, the interior space required for accommodating the bent FPC is one of crucial factors to determine the thickness of the product. Thus, how to minimize the thickness of the product without jeopardizing the reliability of the FPC is one of the issues that are deserved to be noticed.

SUMMARY OF THE INVENTION

It is an object of the present invention to provide an FPC positioning design of an OLED display.

The present invention relates to an organic electroluminescent display. The organic electorluminescent display comprises a substrate, a bonding pad, and an FPC (Flexible Print Circuit). The substrate comprises a luminescent surface and a non-luminescent surface of the substrate. An organic electroluminescent (EL) structure is disposed on the non-luminescent surface to provide the organic EL structure to further electrically connect to an outer circuit. The FPC is disposed on the same side of the organic electroluminescent structure, which comprises a junction portion and a main portion, in which the main portion connects to the junction portion and electrically connects to an outer circuit. The junction portion is adapted to connect the bonding pad and the main portion is directly extended to the direction of the organic electroluminescent structure.

To sum up, the present invention provides a special design and successfully increases the reliable degree of the product by omitting the bending process of the FPC and thus reduces the size of the product.

BRIEF DESCRIPTION OF THE DRAWINGS

The present invention will now be specified with reference to its preferred embodiment illustrated in the drawings, in which.

DESCRIPTION OF THE PREFERRED EMBODIMENT

The present invention discloses an organic EL display having an FPC extending to the organic EL structure.

Figure 1:
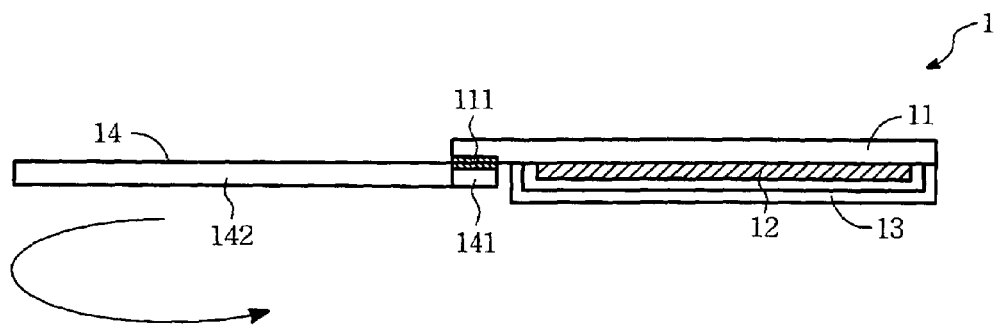
FIG. 1 is a side view of the organic EL display module.
Figure 2:
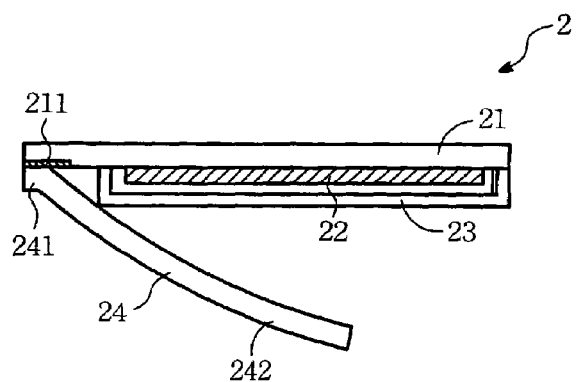
FIG. 2 is a side view of one embodiment of the organic EL display.

Please refer to FIG. 2, which is a side view of one embodiment of the organic EL display 2. The organic EL display comprises a substrate 21, an organic EL structure 22, a package frame 23, and an FPC 24.

The organic EL structure 22 is disposed under the glass substrate 21. The organic EL structure 22 comprises an upper electrode, an organic multilayer structure, and a lower electrode, in which the organic multiplayer further comprises a hole injection layer, an active layer, and an electron injection layer. The organic EL structure comprises an organic light emitting diode (OLED) or a polymer light emitting diode (PLED).

The upper electrode electrically connects the FPC 24 via a bonding pad 211 of the substrate 21. The FPC 24 comprises a junction portion 241 and a main portion 242. As shown in FIG. 2, the FPC 24 connects the bonding pad 211 via the junction portion 241, and the main portion 242 extends to the direction toward the organic EL structure 22. The FPC 24 can receive an image control signal from outer circuits to control the image display of the organic EL display module.

The FPC 24 of the present invention extends to the direction toward the organic EL structure, and thus the bending process of the FPC 24 can be omitted while the FPC 24 is assembled into a product case. In the present invention, less bending the FPC 24 can increase the reliability of the FPC but decrease the thickness of the product case.

It is clear that the present invention provides a preferable direction of the FPC junction superior to the prior design Also, this invention can utilize the same fabricating machine as the prior design uses. Here, two examples are shown to demonstrate how the FPC connects to the substrate.

Figure 3:
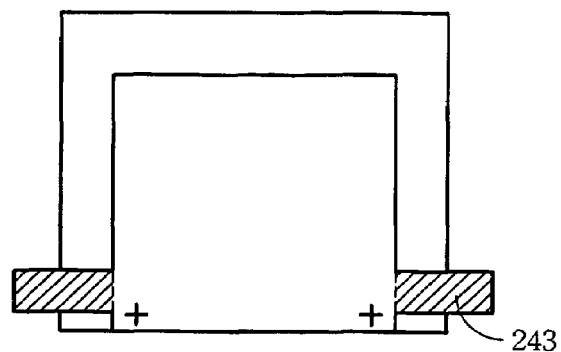
FIG. 3 shows how the substrate connects with the FPC.

Please refer to FIG. 3, which shows how the substrate connects with the FPC. The FPC 24 shown in FIG. 3 comprises an adsorb section 243, which provides the mode absorbing and connecting to the substrate 21. After the FPC 24 is orientated to a specific position, the adsorb section can be removed by hands or by machine cutting.

Figure 4:
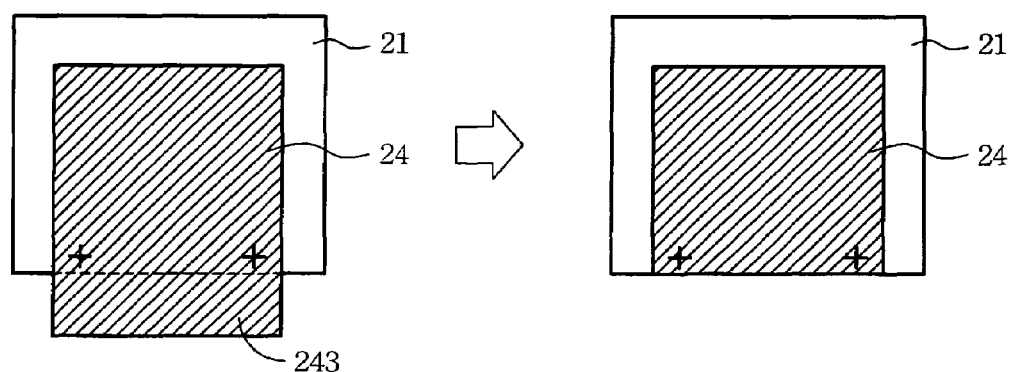
FIG. 4 shows how the substrate connects with the FPC alternatively another way.

Please refer to FIG. 4, which shows how the substrate connects with the FPC via another way. The FPC 24 shown in FIG. 4 comprises an adsorb section 243, which provides the mode absorbing and connecting to the substrate 21. After the FPC is orientated to a predetermined position, the adsorb section can be removed by hands or by machine cutting. The material of the adsorb section 243 could be any easy-to-cut material or just as same as that of the FPC.

The two connection methods described above are just provided for the typical mode. It is understood that there's still lots of methods available and familiar to the skilled person in the art, even that the modes are slightly different to the one describe above.

To sum up, the present invention provides a special design and successfully increases the reliability of the product by omitting the bending upon the FPC and thus reduces the size of the product by saving the interior space of the product.

While the present invention has been particularly shown and described with reference to a preferred embodiment, it will be understood by those skilled in the art that various changes in form and detail may be without departing from the spirit and scope of the present invention.

We claim:

1. An organic electroluminescent (EL) display, comprising:
    a substrate having a luminescent surface and a non-luminescent surface;
    an organic EL structure disposed on the non-luminescent surface of the substrate;
    a bonding pad located directly on the non-luminescent surface of the substrate and electrically connected to the organic EL structure and an outer circuit; and
    an flexible printed circuit (FPC) located on the non-luminescent surface of the EL structure, having a junction portion and a main portion, the main portion is connected to the junction portion and electrically connected to the outer circuit;
    wherein the junction portion is connected to the bonding pad, and the main portion is directly extending over the organic EL structure.

2. The organic EL display according to claim 1, wherein the organic EL structure comprises an organic light emitting diode (OLED).

3. The organic EL display according to claim 1, wherein the organic EL structure comprises a polymer light emitting diode (PLED).

* * * * *